United States Patent
Krijne et al.

(10) Patent No.: US 9,064,740 B2
(45) Date of Patent: Jun. 23, 2015

(54) MEASUREMENT DEVICE AND METHOD FOR VAPOUR DEPOSITION APPLICATIONS

(75) Inventors: Johannes Krijne, Best (NL); Jürgen Eser, Titz (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/112,571

(22) PCT Filed: Apr. 16, 2012

(86) PCT No.: PCT/IB2012/051871
§ 371 (c)(1),
(2), (4) Date: Oct. 18, 2013

(87) PCT Pub. No.: WO2012/143840
PCT Pub. Date: Oct. 26, 2012

(65) Prior Publication Data
US 2014/0186974 A1   Jul. 3, 2014

(30) Foreign Application Priority Data
Apr. 20, 2011 (EP) .................................... 11163118

(51) Int. Cl.
*H01L 21/00* (2006.01)
*H01L 21/66* (2006.01)
(Continued)

(52) U.S. Cl.
CPC ............ *H01L 22/12* (2013.01); *G01B 11/0625* (2013.01); *G01B 11/0641* (2013.01); *H01L 2924/0002* (2013.01); *H01L 51/001* (2013.01);
(Continued)

(58) Field of Classification Search
CPC ................................. H01L 21/66; G01B 11/06

USPC ................................. 438/5; 356/630; 118/712
See application file for complete search history.

(56) References Cited

U.S. PATENT DOCUMENTS 4,828,391 A    5/1989   Zueltzke et al.
6,472,237 B1 * 10/2002   Frisa et al. ...................... 438/14
(Continued)

FOREIGN PATENT DOCUMENTS

EP         2261388 A1   12/2010

OTHER PUBLICATIONS

Vladimir Matias et al; "Linear Combinatorial Approach to Thin Film Research", Review of Scientific Instruments, vol. 78, 2007, pp. 1-7.
(Continued)

*Primary Examiner* — Caleb Henry
(74) *Attorney, Agent, or Firm* — Yuliya Mathis

(57) ABSTRACT

In vapor deposition applications, especially OLED mass production, where it is necessary to measure and/or control the deposition rate of evaporation sources within specific tolerances, a measurement system is adapted to use robust and accurate optical thickness measurement methods at high and low rate sources, so that the thickness of a layer deposited on a substrate can be measured and controlled. A first evaporation source (11) deposits a layer of material on a substrate (20). A mobile element (41) is provided, On which a film is deposited from a second evaporation source (12b) in a deposition location (D1). Subsequently the mobile element is conveyed to a measurement location (D2) where the thickness of the film is measured by a thickness detector (45). The measurement apparatus is arranged to control the deposition of the first evaporation source in dependence on the thickness of the film deposited on the mobile element.

17 Claims, 5 Drawing Sheets

(51) Int. Cl.
*C23C 14/54* (2006.01)
*C23C 14/56* (2006.01)
*G01B 11/06* (2006.01)
*H01L 51/00* (2006.01)

(52) U.S. Cl.
CPC .............. *H01L 22/26* (2013.01); *C23C 14/543* (2013.01); *C23C 14/56* (2013.01)

(56) References Cited

U.S. PATENT DOCUMENTS

| | | | |
|---|---|---|---|
| 6,832,577 B2* | 12/2004 | Nesbitt | 118/713 |
| 7,604,832 B2* | 10/2009 | Ito et al. | 427/8 |
| 2001/0016225 A1* | 8/2001 | Ogata et al. | 427/10 |
| 2002/0097406 A1* | 7/2002 | Fielden et al. | 356/630 |
| 2002/0129770 A1* | 9/2002 | Okamoto et al. | 118/723 EB |
| 2002/0180961 A1* | 12/2002 | Wack et al. | 356/237.2 |
| 2002/0180986 A1* | 12/2002 | Nikoonahad et al. | 356/600 |
| 2005/0208698 A1* | 9/2005 | Winters et al. | 438/99 |
| 2006/0124057 A1* | 6/2006 | Sasaki | 118/712 |
| 2006/0201423 A1* | 9/2006 | Akimoto et al. | 118/712 |
| 2006/0228473 A1* | 10/2006 | Satoh et al. | 427/248.1 |
| 2007/0004051 A1* | 1/2007 | Okumoto et al. | 438/5 |
| 2007/0071890 A1* | 3/2007 | Yoshihara et al. | 427/240 |
| 2007/0260422 A1* | 11/2007 | Marcus et al. | 702/172 |
| 2007/0292598 A1* | 12/2007 | Tada et al. | 427/8 |
| 2008/0057194 A1* | 3/2008 | Tanaka | 427/240 |
| 2008/0078948 A1* | 4/2008 | Saito | 250/492.2 |
| 2008/0098957 A1* | 5/2008 | Ryu et al. | 118/712 |
| 2008/0176412 A1* | 7/2008 | Komeda | 438/778 |
| 2008/0180697 A1* | 7/2008 | Sawabe et al. | 356/630 |
| 2008/0264338 A1* | 10/2008 | Otsuki et al. | 118/712 |
| 2009/0086217 A1* | 4/2009 | Hayashihara et al. | 356/630 |
| 2009/0194024 A1* | 8/2009 | Burrows et al. | 118/712 |
| 2010/0092665 A1 | 4/2010 | Sudou | |
| 2010/0105154 A1* | 4/2010 | Wang et al. | 438/15 |
| 2010/0233353 A1* | 9/2010 | Martini et al. | 427/8 |
| 2010/0298738 A1* | 11/2010 | Felts et al. | 600/576 |
| 2010/0316788 A1* | 12/2010 | Dieguez-Campo et al. | 427/8 |
| 2011/0076790 A1* | 3/2011 | Ofuji et al. | 438/17 |
| 2011/0079178 A1* | 4/2011 | Schramm et al. | 118/712 |
| 2011/0139071 A1* | 6/2011 | Oladeji | 118/712 |
| 2011/0177622 A1* | 7/2011 | Britt et al. | 438/5 |
| 2011/0235056 A1* | 9/2011 | Matsudo et al. | 356/630 |
| 2012/0009706 A1* | 1/2012 | Choi et al. | 438/34 |
| 2012/0033235 A1* | 2/2012 | Leipnitz | 356/630 |
| 2012/0145077 A1* | 6/2012 | Chang et al. | 118/712 |
| 2012/0180724 A1* | 7/2012 | Kouketsu et al. | 118/712 |
| 2012/0183676 A1* | 7/2012 | Sonoda et al. | 427/8 |
| 2012/0237682 A1* | 9/2012 | Hong et al. | 427/282 |
| 2012/0258239 A1* | 10/2012 | Hoffmann | 427/10 |
| 2012/0260855 A1* | 10/2012 | Cho et al. | 118/696 |
| 2012/0266818 A1* | 10/2012 | Shyu et al. | 118/712 |
| 2013/0005054 A1* | 1/2013 | Yamazaki et al. | 438/5 |
| 2013/0008379 A1* | 1/2013 | Chang et al. | 118/712 |
| 2013/0009177 A1* | 1/2013 | Chang et al. | 257/88 |
| 2014/0014917 A1* | 1/2014 | Lee et al. | 257/40 |
| 2014/0030825 A1* | 1/2014 | Park et al. | 438/5 |
| 2014/0153003 A1* | 6/2014 | Miyakawa et al. | 356/630 |

OTHER PUBLICATIONS

Lila Raj Dahal et al; "Application of Real Time Spectroscopic Ellipsometry for Analysis of Roll-To-Roll Fabrication of Si:H Solar Cells on Polymer Substrates", IEEE, 2010, pp. 631-636.

* cited by examiner

MEASUREMENT DEVICE AND METHOD FOR VAPOUR DEPOSITION APPLICATIONS

FIELD OF THE INVENTION

The present invention relates to a system, apparatus, device, method and computer program product for determining the deposition rate of an evaporation source resp. the thickness of a layer deposited on a substrate in vapour deposition applications, especially in OLED mass production, in order to measure and/or control the deposition rate of evaporation sources within specific tolerances.

BACKGROUND OF THE INVENTION

Vapour deposition technology is commonly used in industry in order to provide substrates with layers of defined material and thickness in a fully automated process, especially in vacuum chambers. As an option for controlling the correct functioning of a depositing device, the thickness of the deposited layer can be indirectly determined by depositing a film on a separate sensor, especially simultaneously to the deposition of the layer on the substrate. The philosophy is that the measurement of the thickness of the film on the sensor can provide data for deducting the thickness of the layer on the substrate.

Recently, the manufacturing and vaporisation of substrates, e.g. substrates for organic light emitting diodes (OLEDs), requires the deposition of relatively thin layers of different materials, e.g. organic and/or metallic materials, with defined layer thicknesses within small borders resp. tolerances. The deposition of these layers is usually done by inline vacuum deposition tools which are operated for several weeks without maintenance. To achieve the required layer thickness tolerances, it is necessary to measure and control the deposition rates of the used (organic) evaporation sources very accurately. The common way to measure the deposition rate of an evaporation source is to use a so called quartz crystal oscillator. Such a rate sensing oscillator can be mounted e.g. inside a deposition beam, and the organic layer can be deposited onsite the quartz crystal in parallel to the vapour deposition on the substrate. The quartz crystal oscillator is typically calibrated to the layer thicknesses on the substrate by a tooling measurement, wherein a test layer is deposited onto a substrate. The thickness of this test layer can be measured by so called ellipsometry or so called reflectometry and set in relation to the measured rate sensing oscillator signal during the test deposition.

Thereby, the so called quartz crystal oscillators are state of the art sensors to measure deposition rates in deposition tools, but there are several disadvantages, especially for industrial applications. For example, the lifetime of the quartz is very limited and is therefore determining the maintenance period for the deposition tool. Further, the measurement accuracy of these quartz crystal oscillators is often just at the limit to control the deposition rate of the evaporation sources within the required tolerances. Further, the reliability of these quartz sensors may be not sufficient to operate an industrial mass production tool with the required uptime. Also, the sensor-reading is often and easily disturbed by external factors like cooling water, vacuum fluctuations, and vibrations and so on.

These disadvantages are known by industry. Therefore, sensor suppliers offer revolver systems with e.g. six or twelve quartzes to compensate the problems of reliability and life time. That is to say, a multitude of sensors is provided to measure the layer thickness. But this also implicates further problems like different error of measurement with respect to each of these sensors, or the requirement of calibration for a multitude of sensors. In other words, e.g. for OLED mass production where it is necessary to control the deposition rate of the organic sources within specific tolerances, state of the art sensors regularly cannot guarantee an exact deposition rate within the required tolerances, especially not with a sufficient uptime and robustness.

Since some years, some equipment suppliers promote to measure the thicknesses of the deposited layers inline onside the substrates by ellipsometry or reflectometry, and to feedback this measurement to control the deposition rates of the evaporation sources. But this measurement technique is not successfully realized until now, and it is questionable if it will be possible for all layers within the required accuracy. Mainly, the following problems are limiting this technology. The measurement of the layers of a multilayer stack (which is necessary to measure directly on the substrate) is very complicate resp. laborious, and needs to be developed on new for each stack. Further, there is a minimum layer thickness, typically 10-20 nm, for enabling a measurement with sufficient accuracy. But e.g. in an OLED stack, there are typically a lot of layers which are thinner than 10-20 nm, so that especially the dopants cannot be measured by this method.

SUMMARY OF THE INVENTION

It is an object of the present invention to provide a device and method for enhanced determination of the thickness of a layer or of at least one layer provided on a substrate. It is also an object of the present invention to provide a device and method for enhanced determination of the layer thickness simultaneously to the manufacturing and vaporisation process of the substrates, wherein it should be possible to preserve the design of a conventional evaporation source to a great extent, especially the design of an organic low-rate source arranged within an evaporation chamber. That is to say, the use of a robust and accurate thickness measurement method at high and/or low rate sources should be possible in conventional applications, but replacing resp. making dispensable the oscillators used until now. Also, it is an object to provide a device and method for continuous determination of the thickness of thin layers, in particular layers thinner than 20 or even 10 nm. Further, it is an object to provide an improved rate measurement sensor for thermally evaporated (organic) materials which can be calibrated easily. In other words, the present invention aims at providing device and method for more reliable measurement of deposition rate resp. determination of substrate layer thickness in conventional vapour deposition applications.

At least one of these objects is achieved by a measurement apparatus as claimed in claim 1, an evaporation device as claimed in claim 6, a system as claimed in claim 13, and a method as claimed in claim 9.

Accordingly, the measurement apparatus for determination of the layer thickness is provided in such a way that a film can be deposited on a surface of a mobile element resp. movable element (e.g. of a band-like conveyor) which can be in motion or stagnant during deposition, and the thickness of the film can be predefined in dependence on a multitude of variables in order to provide good measurement accuracy, as further explained below. Thereby, a measurement and/or control of the thickness of a layer which is to be deposited on a substrate can be provided, by indirectly determining the deposition rate of a first evaporation source in dependence on the thickness of the at least one film deposited on the mobile element claimed in claim 1. Thereby, such a movable element can be provided, e.g., as a band-conveyor, or as a kind of disk, circle or round slice or sheave, especially a rotatable disk. In particular, with a disk, deposition and detection can be carried out at different segments, wherein the disk can be provided with at least two different materials, especially different surfaces resp. lateral areas. In particular, a band-conveyor can be provided in the form of a conveyor band or flat conveyor, that is to say, a conveyor in the form of a tape or strip, which has, advantageously, a small thickness, e.g. any film-like material, e.g. in order to provide a long maintenance period. The rigidity or stiffness of such a tape can be designed, based on experience or calculations, e.g., in view of the thickness of the deposited film, and/or in view of the absolute dimensions of the measurement apparatus, or on any tensile force within the tape. Alternatively, the mobile element can be provided in the form of an essentially inflexible material.

Generally, the deposited layers can be provided in the form of an organic material and/or in the form of a metallic material, and the type of material does not necessarily imply a specific arrangement or method for detecting layer thickness resp. film thickness. In other words, a measurement apparatus, an evaporation device, a system and a method can be designed independently of the type of material.

Thus, an advantageous method to measure the deposition rate with a good accuracy is to deposit a single layer film, especially of 20-100 nm or even 10-200 nm thickness, and to measure the film thickness by commonly used techniques, especially by ellipsometry or reflectometry, wherein the measurement can be temporally shifted with respect to the respective moment of layer deposition. Thereby, generally, with ellipsometry or reflectometry, thicknesses in the range of 1 nm to 100 μm can be measured, but with respect to the applications mentioned above or in the following, it is reasonable to use an ellipsometer or reflectometer which is configured to accurately measure in the range of 10 to 200 nm. The accuracy, repeatability and reliability of such a measurement is excellent, that is to say, very satisfying, and the layer thickness determination can be effectuated independently of a multitude of quartz crystal oscillators, and also independently of the effective thickness of a layer deposited on a substrate, a robust and accurate measurement mechanism for detection with commonly known thickness detector can be provided. Thereby, the rate measurement sensor system for determining thicknesses of thermally evaporated (organic) material layers can be designed such that thickness detector can be installed at the same position as a conventional quartz oscillator or at an appropriate location inside the deposition chamber.

In other words, the thickness detector can consist of a mobile element moved in front of a supplementary evaporation source, e.g. one or a plurality of nozzles, with an adjustable, especially constant speed. In a specific arrangement, the speed can be zero, at least temporally, especially in case the substrate is not transferred continuously during deposition. In contrast to conventional nozzles for depositing a film on conventional oscillator heads, the supplementary evaporation source can be designed specifically, e.g. in geometry and/or dimensions, in order to deposit a film with an optimal film thickness in dependence on the detection ability of thickness detector. While the movable element is passing the supplementary evaporation source, a film of evaporated material is deposited onside the mobile element, whereupon the thickness of the evaporating film can also be adjusted easily by several parameters like evaporation source dimensions, distance of the mobile element to the source and in particular by the speed of the mobile element, that is to say the transport speed of a band-conveyor or the rotation speed of a disk, so that even in case a very thin layer, e.g. 10 nm or even less than 5 nm, is to be deposited on a substrate, accuracy in determining the layer thickness (by accurately detecting film thickness) can be ensured.

Thereby, a second evaporation source can be provided at a location different from the location of a first evaporation source, or also at a location basically corresponding to the arrangement of a first evaporation source. That is to say, not only temporally, but also locally, the deposition of a film can be carried out in parallel to the deposition of a layer. In other words, a second evaporation source can be oriented and arranged such that the vapour is provided at least approximately in the same direction as the vapour provided by a first evaporation source. Respectively, a movable element can be moved at least approximately at the same location as a substrate. Also, a movable element can be moved both in the same direction and at least approximately at the same location as a substrate. Alternatively, a movable element resp. mobile element can be moved directly in the deposition beam of a first evaporation source, a second evaporation source being provided only optionally.

As mentioned above, the thickness of the film deposited on the measuring mobile element can be adjusted completely independently from the thickness of the layer deposited on the substrate, resulting in the possibility of depositing sufficiently thick layers for measurement even on low-rate evaporation sources. Thereby, upon deposition, the mobile element, especially a band-conveyor resp. tape can be transferred, e.g. by one or a set of deflection pulleys, to the measurement head of thickness detector, e.g. an ellipsometer or a reflectometer, that is able to measure the thickness of the film deposited on the mobile element, wherein the rate of measurement is advantageously proportional to the thickness of the deposited layer on the substrate, i.e. film thickness is proportional to layer thickness. Thereby, the measurement head can be installed directly inside the evaporation chamber or outside of it, and viewed through a viewport of the chamber; the initial calibration can be performed through a tooling process, especially similar to a tooling process used for quartz crystal oscillators.

In other words, if the single layer film is deposited on a mobile element which is running independently from the deposition process for substrate layers, the required film thickness can be easily reached, even for very low rate deposition sources. Thereby, an appropriate film thickness as well as adequate accuracy can be ensured, e.g. by reducing the speed of the mobile element. Thus, even for doped layers which are relatively thin, e.g. layers in an OLED stack each with a thickness below 10 nm, it is possible to deposit different materials independently on the mobile element, and to measure single layer films. The uptime of such a measurement tool might be limited by the dimensions of the mobile element, i.e. by the length of a band-conveyor or by the diameter of a disk-like turning device, but, advantageously, a band-conveyor can be provided in a cassette system so that by designing the cassette system with appropriate dimensions, uptime is not a limiting factor. Thereby, the rate sensor resp. measurement apparatus with thickness detector can be applied on all kind of (thermal) evaporation sources, where thin films are deposited, and these layers can be measured (indirectly) by ellipsometry or reflectometry. Such thickness detector is especially interesting at the organic layer deposition for the OLED production, where the state of the art sensor, especially the quartz crystal oscillator, is coming to its limits.

According to a first aspect, the measurement apparatus can be arranged to provide the mobile element from a deposition location to a detection location within a specific time delay indicating the time a specific surface area of the mobile element requires to pass from the deposition location to the detection location. The time delay can be e.g. in the order of several seconds or several minutes. Advantageously, the time delay is at least in the order of several seconds, e.g. 5 to 10 seconds, so that in the meanwhile, a film deposited on the mobile element can be presented with a consistency adequate for the measurement technique of the thickness detector, e.g. with a specific humidity value. Further, advantageously, the time delay is at most in the order of several minutes, e.g. 5 to 10 minutes, so that a faulty thickness layer can be detected within a process time which is not too long in order to avoid excessive rejections resp. increased consumption of material and energy. Further, for a specific instant of time of detection, the measurement apparatus can be arranged to correlate a specific surface area of the mobile element with the instant of time of deposition, so that the thickness of the film in this surface area can be detected in correlation to the instant of time of deposition of both the film as well as the layer. Thereby, a correlation can simply be achieved by timing means and/or motion detection means, relating to the motion of the substrate and/or the mobile element, so that a defect or fault in layer thickness can be related to a specific area of the substrate. Thus, even in case for a specific processing period, the deposited layer had been provided with a thickness out of tolerance, the substrate can be preserved in such a way that the areas of the substrate which had been processed correctly are identified.

According to a second aspect which can be combined with the above mentioned first aspect, the measurement apparatus can be arranged to adjust the time delay between the instant of time of deposition and the instant of time of detection with reference to a deposition spot at the deposition location and a detection spot at the detection location. Thereby, the time delay can be adjusted, e.g. in the range of several seconds to several minutes, so that an optimum between criteria like film consistency and so on and the danger of excessive rejections can be found.

According to a third aspect which can be combined with the above mentioned first and second aspects, an actuator device can be arranged to adjust the speed of conveyance, especially in dependence on a thickness value of an optimal thickness of the film. The thickness detector can be arranged to optically detect the thickness of the film. The actuator device can comprise a feeder and a cassette. The thickness value of an optimal thickness of the film is advantageously in the range of about 10 to 200 nm, e.g. 50 nm in case of a layer thickness of 5 nm, for ellipsometry or reflectometry. Other values for an optimal thickness can be in the range of 30 nm, or 70 nm, or e.g. 150 nm, depending on e.g. the material of the mobile element and/or the detection technique and/or the speed of conveyance. Also, the film can be measured in case it is only 10 nm thick, depending on e.g. the material of the mobile element and/or the detection technique and/or the speed of conveyance. In other words, the mobile element, e.g. band-conveyor resp. tape, used for the thickness detector can be handled by a feeding mechanism, e.g. a cassette-band-conveyor system or a rotary drive, which can easily be replaced, especially during equipment maintenance. Thereby, the value of optimal thickness can be defined not only in dependence on the measurement abilities of the thickness detector, but also in dependence on the type of cassette system in order to provide optimal film consistency of a film which is to be spooled within a cassette.

According to a fourth aspect which can be combined with the above mentioned aspects, the actuator device can be provided in the form of a cassette-tape system comprising not only a feeder and a cassette, but also at least one deflection pulley. Thereby, the position of the film with respect to the evaporation source can be adjusted, e.g. by position adjusting means provided at the rotation axis of the deflection pulley, the position adjusting means being provided e.g. in the form of a rail guide. Such position adjusting means can be provided in conjunction with film tension adjusting means, even though film tension adjusting means can also be provided by the actuator device itself, e.g. by a brake mechanism provided within the feeder of a cassette system. Further, the mobile element can be provided in the form of a tape, especially a tape made of plastic or metal foil or glass, with or without additional surface coating, wherein the mobile element material can be compatible with any heat impact during deposition and with the optical measurement technique, i.e. the band-conveyor material can be provided e.g. as a plastic or metal foil with or without additional surface coating. As an alternative, the band-conveyor can be provided in a glass material. Further, the mobile element and the actuator device can be arranged to handle a film with a thickness of about 10 to 200 nm. Thereby, even in case of a thickness in the order of 200 nm, the actuator device can be designed with sufficient buffer resp. storage room so that a sufficiently long maintenance period can be ensured, especially by providing deflection pulleys in such a way that the cassette can be arranged in sufficiently spaced relation to the thickness detector or other elements provided within a vacuum chamber.

According to a fifth aspect which can be combined with any of the above mentioned aspects, an evaporation device with a measurement apparatus can be provided, comprising a first evaporation source in the form of a shower head with a multitude of shower nozzles for depositing at least one layer on a substrate, and a second evaporation source for depositing at least one film on the mobile element provided by the measurement apparatus. The actuator device provided by the measurement apparatus can be arranged to convey the mobile element, i.e. the band-conveyor resp. rotate the disk alongside the second evaporation source so that a film can be deposited continuously, or optionally, at least temporally discontinually, on the mobile element, especially in the deposition location which is located face to face with the second evaporation source. Further, the second evaporation source can be provided at a location face to face with the mobile element, especially at a body structure of the evaporation device. The evaporation device can be arranged to provide a film thickness on the mobile element independently from the thickness of any layer deposited on the substrate, especially proportionally to the thickness of any layer deposited on the substrate. Thereby, even the deposition of thin layers can be controlled, and the film can be provided within a range of optimal thickness, depending on the deposited material and the geometry and arrangement of the actuator device.

The actuator device can be arranged to convey the mobile element with a constant speed of conveyance in order to enable a constant definite correlation of a distance between the deposition spot and the detection spot to a specific instant of time of deposition, so that the thickness of a deposited film can be detected in a location differing from the deposition location, and the thickness of a film deposited at a specific instant of time can be detected by the thickness detector in correlation to the specific instant of time. Thereby, the correlation of a measured film thickness to a defect on a substrate can be facilitated. Alternatively or in addition, the mobile element can be conveyed with a variable resp. varying speed, e.g. halt resp. stoppage during deposition, or, in order to provide a specific surface area of the mobile element to a thickness detector or in the opposite direction, with a considerably higher speed than during deposition. Further, the actuator device and the mobile element can be arranged such that a path length between the deposition location and the detection location can be adjusted so that it is in the range of e.g. several mm to several cm, so that depending on an optimal speed of conveyance, the path length can be provided in order to enable the setting of a specific time delay. Thereby, by adjusting the path length, the characteristics of the deposited film at the instant of time of detection can be adjusted such that the highest accuracy provided by the thickness detector can be deployed.

According to a sixth aspect which can be combined with any of the above mentioned aspects, the mobile element can be arranged to provide the surface on which a film can be deposited by the second evaporation source simultaneously to the deposition of a layer on the substrate with the same feed rate as the feed rate of the substrate so that the speed of conveyance corresponds to the feed rate of the substrate. Thereby, the correlation of a measured film thickness to a defect on a substrate can be facilitated. Further, the evaporation device can be arranged to correlate, especially based on specific time delay information provided by the measurement apparatus, the measured film thickness to the thickness of a layer deposited on the substrate by the first evaporation source in order to determine the thickness of the layer. Thereby, a correlation by the evaporation device, e.g. by a processor provided within the evaporation device, can provide the advantage that there is no need to provide further links resp. connections to any correlating device outside the vacuum chamber.

According to a seventh aspect which can be combined with any of the above mentioned aspects, the measurement apparatus can be arranged in a location face to face with the location of a conventional quartz crystal oscillator or in a location in which a conventional quartz crystal oscillator alternatively could be arranged, so that no substantial design reviews are required when a state of the art oscillator has to be refitted by the measurement apparatus. Further, vapour for evaporating the substrate and the mobile element can be provided by an evaporator arranged at the evaporation device, so that no further vapour generator for the vapour to be deposited on the film is required. Further, the evaporation device can be arranged to adjust the thickness of the film deposited on the mobile element by at least one of the size of the second evaporation source, the geometry of the second evaporation source, the distance between of the mobile element and the second evaporation source at the deposition spot, and/or the speed of conveyance, so that for each specific design, the variable which can be adjusted easily can be chosen in order to adjust the measurement system. Further, the second evaporation source and the measurement apparatus can be arranged to deposit different materials independently on the mobile element and to measure single layer films, so that the processing of a multilayer OLED stack can be simulated and controlled with only one mobile element.

Further, a method according to claim 9 can be provided such that simultaneously to passing a substrate alongside a first evaporation source, a mobile element is conveyed alongside a second evaporation source, especially within an evaporation chamber. Thereby, the actuator device can be adjusted, e.g. in position and/or speed, especially with respect to a target value of the thickness of a respective layer deposited on the substrate, in order to provide a film with a thickness value of an optimal thickness of the film, especially in the order of 20 to 200 nm, so that an optimal thickness of the film, e.g. with respect to the thickness detection technique, can be provided.

Also, detection of the thickness of the deposited film in a detection location by thickness detector can be carried out, wherein the detection location can differ from the deposition location in such a way that detection can be carried out after a specific time delay indicating the time a specific surface area of the mobile element requires to pass from the deposition location to the detection location. The time delay can be in the range of several seconds to several minutes. Further, for a specific instant of time of detection, the measurement apparatus can be arranged to correlate a specific surface area of the mobile element with the instant of time of deposition, so that the thickness of the film in this surface area can be detected in correlation to the instant of time of deposition.

Also, the apparatus can be arranged for continuously, or, at least temporally discontinuously, providing the mobile element from the deposition location to the detection location, so that the thickness of a deposited film can be detected in a location differing from the deposition location. Further, the reading of detection, especially optical detection, can be proportional to the thickness of a layer deposited on a substrate. Thereby, the correlation of a measured film thickness to a defect on a substrate can be facilitated. Nonetheless, there can be applications where it is advantageous or unavoidable to correlate the film thickness to the layer thickness based on unproportional relation, so that alternatively or in addition, a reading can be provided which is not proportional.

Also, an initial calibration can be performed through a tooling process similar to a tooling process used for conventional quartz crystal oscillators. Thereby, no substantial design reviews or reeducation of service personal is required. Further, the substrate can be passed continuously alongside the shower head, so that the motion of the mobile element can be synchronized to the motion of the substrate, especially in both opposed directions respectively.

Further, a system according to claim 13 can be provided such that the measurement apparatus is in communication with the second evaporation source in order to adjust the actuator device provided by the measurement apparatus such that a respective film can be deposited with a thickness of about 10 to 200 nm. Further, alternatively, vapour for evaporating the mobile element can be provided by a supplementary evaporator different than the evaporator providing vapour for evaporating the substrate, so that in case of e.g. dopants or any precarious or costly resp. high priced layer material, the film deposited on the mobile element can be provided in the form of a nonhazardous and/or cost-saving material.

Of course other measuring options can be used. For example, the thickness detection could also be carried out based on acoustics, so that it is not necessarily required to make provisions for optical detection.

The above apparatus may be implemented as a hardware circuit integrated on a single chip or chip set, or wired on a circuit board. As an alternative, at least parts of the apparatus may be implemented as a software program or routine controlling a processor or computer device.

It shall be understood that the measurement apparatus of claim 1, the evaporation device of claim 6, the method of claim 9, the system of claim 13 and the computer program of claim 15 have similar and/or identical preferred embodiments, in particular, as defined in the dependent claims.

It shall be understood that a preferred embodiment of the invention can also be any combination of the dependent claims with the respective independent claim.

These and other aspects of the invention will be apparent from and elucidated with reference to the embodiments described hereinafter.

DETAILED DESCRIPTION OF EMBODIMENTS

In the following embodiments, an enhanced system for determining the deposition rate of an evaporation source resp. the thickness of a layer deposited on a substrate is proposed where the thickness of a film can be detected independently from layer deposition.

According to the embodiments, the thickness of the film can be provided such that thickness detection can be carried out with high accuracy, independently of the layer thickness. Hence, even the deposition of very thin layers can be controlled. I.e., the embodiments provide method and device for enhanced substrate manufacturing.

In the following, three embodiments using adjustable measurement apparatus resp. thickness detector are described, starting from the commonly used state of the art arrangement.

Figure 1:
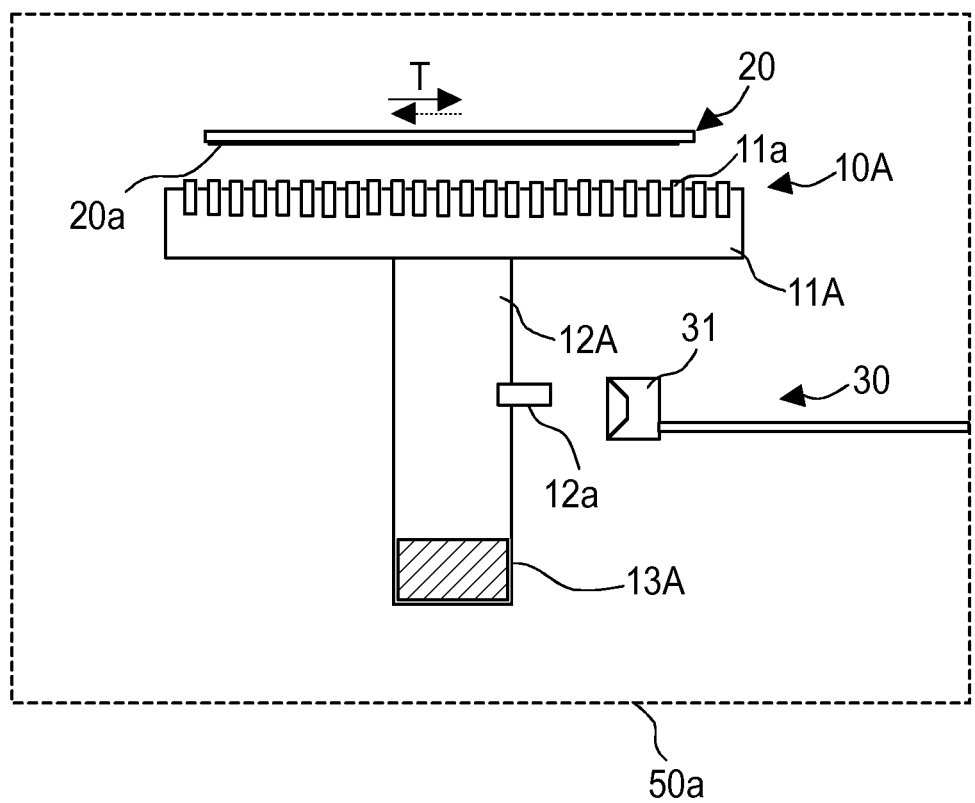
FIG. 1 shows a schematic drawing of a commonly used sensor arrangement, i.e. a state of the art arrangement within an evaporation chamber.

FIG. 1 shows a system according to the state of the art, provided with a rate sensor in the form of an oscillator. A substrate 20 is provided adjacent to a shower head 11A of an evaporation device 10A, the evaporation device 10A further comprising a shower head body 12A coupled to the shower head 11A. At the shower head 11A, several shower nozzles 11a are provided for evaporating vapour which is to be deposited on the substrate 20, the vapour originating from a thermal evaporation source 13A arranged within the shower head body 12A. The substrate 20 is passed alongside the shower head 11A, especially in transferring direction T, i.e. orthogonally to the orientation of the shower nozzles 11a, wherein both opposed directions indicated in FIG. 1 are possible. All system parts are arranged within evaporation chamber 50a. At the shower head body 12A, an evaporation nozzle 12a is provided in order to deposit vapour on the sensor head of a state of the art rate sensing oscillator 30. In other words, the thermal evaporation source 13A for inline mass production tools is equipped with a shower head body 12A which is distributing the vapour homogeneously to the substrate 20, which is passing the shower head 11A, especially at a constant speed. A conventional rate sensing oscillator (quartz crystal oscillator) 30 is either placed close to the substrate 20 or (as indicated in FIG. 1) in front of the evaporation nozzle 12a, especially laterally to the shower head body 12A. Thereby, the film thickness deposited on the rate sensing oscillator 30 is proportional to the deposition rate on the substrate 20. By measuring the film thickness deposited on the rate sensing oscillator 30, the layer thickness of a layer 20a deposited on the substrate 20 can be deducted.

Figure 2:
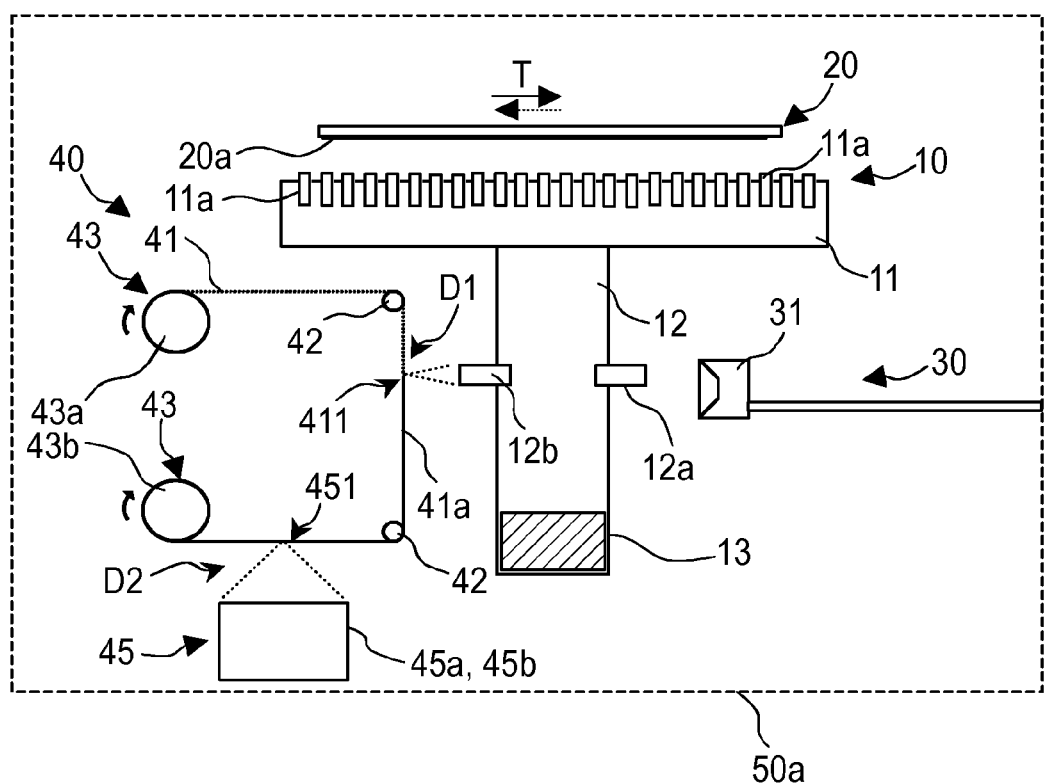
FIG. 2 shows a schematic drawing of a measurement apparatus for layer thickness determination according to a first embodiment, especially arranged within an evaporation chamber adjacent to an evaporation device.

FIG. 2 shows a schematic drawing of a measurement apparatus 40 for layer thickness determination according to a first embodiment, especially arranged within an evaporation chamber 50a adjacent to an evaporation device 10. The measurement apparatus resp. rate sensing device 40 can be placed at a position similar to the position of a conventional rate sensing oscillator 30, e.g. in front of a supplementary evaporation source 12b, as shown in FIG. 2. Thereby, the evaporation source 12b is arranged in a location face to face with the location of a conventional quartz crystal oscillator 30, and this location can correspond to a location in which a conventional quartz crystal oscillator 30 alternatively could be arranged. Although in conjunction with the supplementary evaporation source 12b, the measurement apparatus 40 can replace a conventional quartz crystal oscillator 30 with its oscillator head 31 and an evaporation nozzle 12a which, in the state of the art, is provided to deposit a film on the conventional quartz crystal oscillator 30, these components 12a, 30, 31 are shown in FIG. 2 in order to point out that the measurement apparatus 40 and the components 12a, 30, 31 may coexist, especially within the evaporation chamber 50a. In such a way, both conventional oscillator 30 and measurement apparatus 40 and/or redundancy of the measurement apparatus 40 can be provided without substantial design reviews of the evaporation device 10. According to this embodiment, the rate sensor 40 can consist of a band-conveyor resp. tape 41 which is moved in front of the evaporation source 12b with an adjustable speed. This speed of conveyance is advantageously constant, but it can be adjusted continuously depending on the layers actually deposited on the substrate 20, so that the speed is constant with respect to a specific layer 20a, but can vary between e.g. two different layers deposited sequently. While the tape 41 is passing the evaporation source 12b, a film 41a of evaporated material is deposited onside the tape 41. Thereby, the thickness of this film 41a can be adjusted easily by several parameters like e.g. size and geometry of the evaporation source 12b, the distance from the tape 41 to the evaporation source 12b and particularly also by the conveying speed of the tape 41. Further, as another advantage provided by such a measurement apparatus 40, the film thickness of the film 41a deposited on the measuring tape 41 can be adjusted completely independent from the real thickness of the layer 20a deposited on the substrate 20. Therefore, it is possible to deposit sufficiently thick films 41a for measurement even at low-rate sources, e.g., even in case of a layer thickness of the layer 20a in the range of 5 to 10 nm or even thinner than 5 nm, the film 41a on the measuring tape 41 can be provided with sufficient thickness, so that even the deposition of dopants on the substrate 20 can be controlled. According to one exemplary method, this can especially be done by calibrating the measurement apparatus 40 such that in case of layer thicknesses in the range of 5 to 10 nm or even thinner, a disproportionately high film thickness is provided on the tape 41. Nonetheless, generally, the thickness of the film 41a deposited on the tape 41 can be proportional to the deposited layer thickness on the substrate 20. In other words, a calibration of the measurement apparatus 40 can be done such that the thickness of the film 41a deposited on the tape 41 is proportional to the thickness of the layer 20a deposited on the substrate 20, and alternatively or in addition, for layer thicknesses in the range of 5 to 10 nm or even thinner than 5 nm, a disproportionately high film thickness can be provided on the measuring tape 41.

Figure 4:
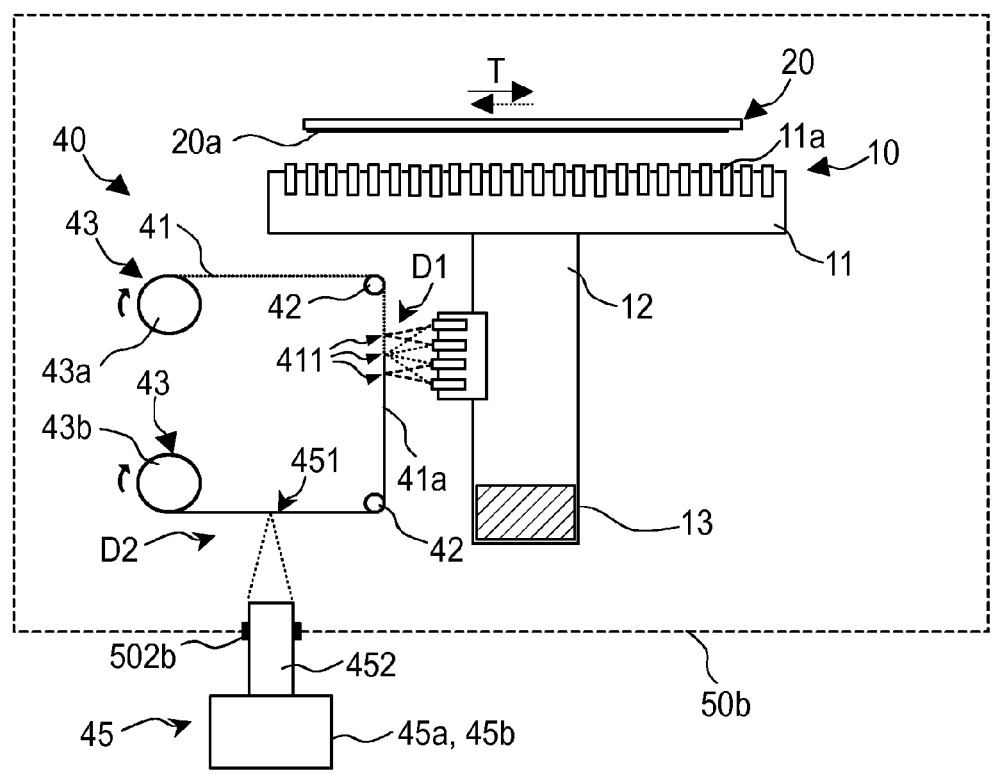
FIG. 4 shows a schematic drawing of a measurement apparatus for layer thickness determination according to a third embodiment, especially arranged adjacent to an evaporation device and partially arranged outside an evaporation chamber.

After the film 41a is deposited on a specific section of the tape 41, resp. in parallel to the deposition, the respective tape section is transferred, which can be done continuously and/or at least temporally discontinuously, especially by a set of deflection pulleys 42, to the measurement head of an ellipsometer 45a or a reflectometer 45b respectively, which is able to measure the film thickness on the tape 41, especially optically. Thereby, by adjusting the position of the deflection pulleys simultaneously or each individually, an appropriate distance from the mobile element resp. band-conveyor 41 to the evaporation source 12b resp. to the thickness detector 45 can be set, so that even in case of substantial differences in film thickness, no modifications of the focus or the position of the thickness detector 45 resp. the evaporation source 12b are required. Also, the tension resp. pre-load of the band-conveyor 41 can be adjusted by the position of the deflection pulleys 42 and/or by the friction resp. rolling drag within the feeder 43a. The measurement head of the thickness detector 45 could be installed directly inside a vacuum, i.e. within an evaporation chamber 50a, but alternatively also outside the evaporation chamber in atmosphere and observe the tape 41 through a viewport, as shown in FIG. 4.

The film thickness on the measurement tape 41 can be adjusted in order to get an accurate resp. a more accurate measurement. In particular, a film thickness of 20 to 100 nm or 10 to 200 nm is considered to provide sufficient accuracy, but the exact thickness value $v_t$ of an optimal thickness may depend on the measurement technique, especially the type of ellipsometer 45a or reflectometer 45b, but also on the material of the deposited film 41a or the speed of conveyance for example. The rate sensor 40 shown in FIG. 2 is arranged in such a way that between a deposition spot 411 and a detection spot 451, there is a specific length of run which can be adapted to the measurement requirements in a specific evaporation system. Because of the transport time of the tape 41 from the deposition spot 411 to the detection spot 451, there is a time delay $\Delta_t$ of the measurement, as the film deposited by the supplementary evaporation source 12b during the deposition of the vapour on the substrate 20 passes by the ellipsometer 45a resp. reflectometer 45b depending on e.g. the location in which the ellipsometer 45a resp. reflectometer 45b is arranged. This time delay $\Delta_t$ can vary from several seconds to several minutes, especially depending on tape speed and the geometry of the measurement apparatus 40, e.g. the location of the ellipsometer 45a resp. reflectometer 45b. With respect to the deposition rate, deposition sources are usually quite stable on short timescale, so that a time delay $\Delta_t$ in the order of several seconds to several minutes does not bring about problems with measurement accuracy.

The reading of the measured film thickness can be proportional to the deposited layer thickness on the substrate 20. To calibrate the measurement apparatus 40, it is possible to do a tooling in the same way as it is common for quartz crystal oscillators. Alternatively or in addition, especially in context with thicknesses in the range of 5 to 10 nm or even thinner than 5 nm, by calibrating the measurement apparatus 40 such that a disproportionately high film thickness is provided on the band-conveyor 41, with the same arrangement, also deposited layers 20a with a thickness below e.g. 10 nm can be measured. Nonetheless, generally, the thickness of the film 41a deposited on the tape 41 can be proportional to the deposited layer thickness on the substrate 20.

The band-conveyor 41 used for the measurement apparatus 40 can be handled by a tape feeding mechanism which can be provided in such a way that it can be easily exchanged during equipment maintenance, for example in the form of a cassette-tape system with a feeder 43a and a cassette 43b. In order the tape material to be compatible with heat impact during deposition and with the optical measurement requirements, the tape 41 can be provided for example in the form of a plastic or metal foil with or without additional surface coating.

With this technology, a control of the substrate manufacturing process can be provided with an accuracy independent from the layer thickness, especially over a long period of time, and without the need of replacing any oscillators.

Figure 3:
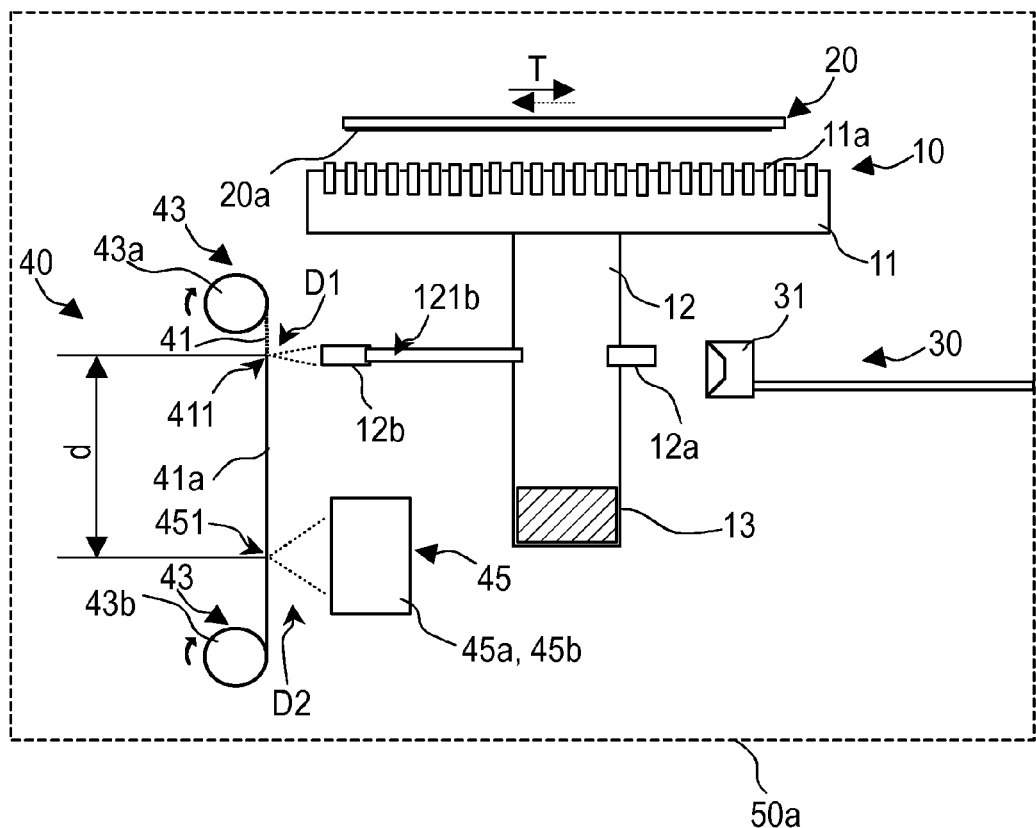
FIG. 3 shows a schematic drawing of a measurement apparatus for layer thickness determination according to a second embodiment, especially arranged within an evaporation chamber adjacent to an evaporation device.

FIG. 3 shows a schematic drawing of a measurement apparatus 40 for layer thickness determination according to a second embodiment, especially arranged within an evaporation chamber 50a adjacent to an evaporation device 10. An actuator device 43 is provided in the form of a feeder 43a and a cassette 43b. In contrast to the arrangement shown in FIG. 2, the band-conveyor 41 resp. mobile element is passed directly from the feeder 43a to the cassette 43b, i.e. no deflection pulleys are provided. This can be advantageous in order to provide a robust design of the actuator device 43, especially in case the supplementary evaporation source 12b is provided at the support 121b which can function as a device to adjust the distance between the evaporation source 12b and the band-conveyor 41. The deposition spot 411 marking the point in which vapour is deposited on the band-conveyor 41 and the measurement spot 451 marking the point in which the film thickness is measured are spaced apart at a distance d, so that within a specific time delay $\Delta_t$ indicating the time a specific surface area of the band-conveyor 41 requires to pass from the deposition location D1 to the detection location D2, for a specific instant of time of detection $t_{d2}$, at a given speed of conveyance, the measurement apparatus 40 can correlate the specific surface area of the band-conveyor 41 with the instant of time of deposition $t_{d1}$, so that the thickness of the film in this surface area can be detected in correlation to the instant of time of deposition $t_{d1}$. Thereby, the speed of conveyance can be measured e.g. within one of the feeder 43a or the cassette 43b, e.g. by detecting angular speed, or directly by the thickness detector 45. Also, a conventional rate sensing oscillator 30 can be provided in conjunction with an evaporation nozzle 12a, wherein the oscillator 30 can be fixed to an inner wall of the vacuum chamber 50a.

With this technology, in addition to any advantages provided by the embodiment shown in FIG. 2, a compact arrangement with a high robustness and low cost and maintenance requirements can be provided.

FIG. 4 shows a schematic drawing of a measurement apparatus 40 for layer thickness determination according to a third embodiment, especially arranged adjacent to an evaporation device 10 and partially arranged outside an evaporation chamber 50b comprising a viewport 502b. In contrast to the embodiments shown in FIGS. 2 and 3, a state of the art oscillator 30 is not shown. As mentioned above, a measurement apparatus 40 can completely replace such a state of the art oscillator 30 and provide further advantages as higher accuracy, especially in context with thin layers 20b. Nonetheless, such a state of the art oscillator 30 can be provided also in this third embodiment. The thickness measurement device 45 is arranged substantially outside the vacuum chamber 50b, and the film thickness can be detected through the viewport 502b. In this third embodiment, three different deposition spots 411 are suggested in order to point out that the evaporation source 12b may be arranged for depositing different films, especially in dependence on the layers of a multilayer OLED stack. This can be done by a single evaporation source 12b or a multitude of evaporation sources 12b, in parallel or sequently, so that a specific mobile element resp. band-conveyor 41 can be used several times. In other words, in order to extend the maintenance period, several films can be provided on the band-conveyor 41, e.g. side by side, adjacent to each other, wherein the band-conveyor 41 can be conveyed in both directions, i.e. once the feeder 43a functions as feeder, and once it functions as cassette, and vice versa the cassette 43b.

With this technology, for a compact evaporation chamber resp. vacuum chamber, or for a system which formerly worked with a state of the art oscillator, a measurement apparatus 40 can be provided without the need of a cost-intensive design review of the evaporation chamber, as the thickness detector can be arranged substantially outside the vacuum chamber.

Figure 5:
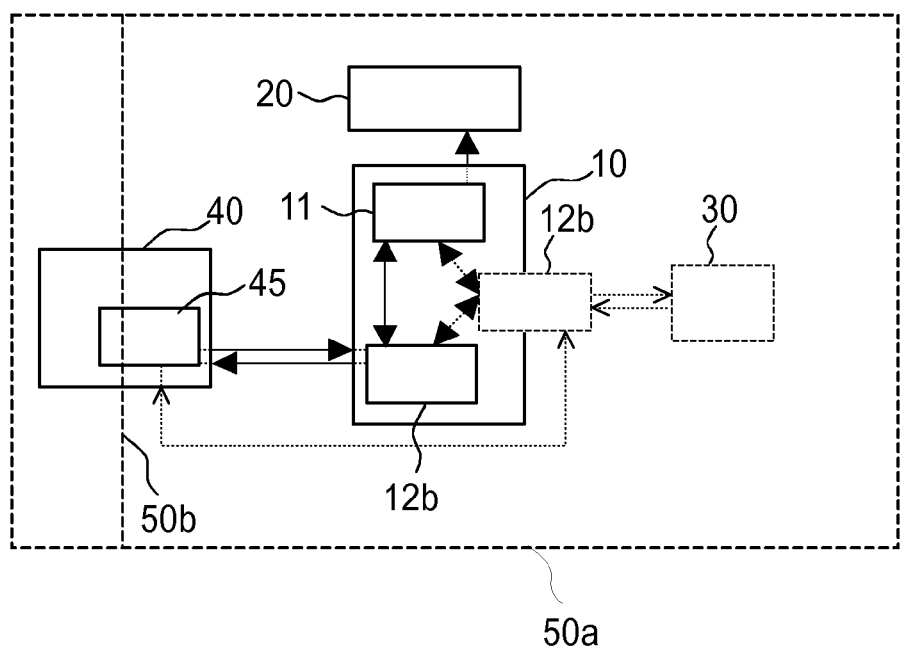
FIG. 5 shows a schematic block diagram of a measurement apparatus and evaporation system according to the invention.

FIG. 5 shows a schematic block diagram of a measurement apparatus 40 and an evaporation system 10, especially provided within a vacuum chamber 50a encompassing the whole arrangement (or alternatively, partially within a vacuum chamber 50b with a viewport for the thickness detector 45), wherein a first evaporation source 11 providing vapour to the substrate 20 is in communication with a second evaporation source 12b providing vapour to the measurement apparatus 40 in order to correlate the thickness of a film of deposited vapour provided to the measurement apparatus 40 to the thickness of a layer of deposited vapour provided to the substrate. Further, the second evaporation source 12b is in communication with the thickness detector 45 of the measurement apparatus 40 in order to correlate, for a specific surface area of the mobile element (not shown, cf. FIGS. 2, 3, 4), the instant of time of deposition to the instant of time of detection, e.g. depending on the speed of conveyance. Communication can be realized wireless or by wired connections. Further, alternatively to a second measurement apparatus or basically in addition to one or several measurement apparatus, a (conventional) state of the art oscillator 30 can be provided, especially in communication with the first 11 and/or second evaporation source 12b, but also in communication with the measurement apparatus 40 in order to match their measured thickness values or to control correct functioning of the respective sensor 30, 40.

With this technology, an enhanced control of the substrate manufacturing process is provided, wherein optionally, a matching or compensation with state of the art oscillators is possible.

In summary, in vapour deposition applications, especially OLED mass production, where it is necessary to control the deposition rate of evaporation sources within specific tolerances, a measurement system is adapted to use robust and accurate optical thickness measurement methods at high and low rate sources, so that the thickness of a layer deposited on a substrate can be measured and controlled.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single processor, sensing unit or other unit may fulfil the functions of several items recited in the claims. The mere fact that certain measures are recited in mutually different dependent claims does not indicate that a combination of these measures cannot be used to advantage.

It is noted that the proposed solution according to the above embodiments can be implemented at least partially in software modules at the relevant functional blocks. The resulting computer program product may comprise code means for causing a computer to carry out the steps of the above procedures of functions of FIGS. 2 and 3. Hence, the procedural steps are produced by the computer program product when run on the computer.

The computer program may be stored/distributed on a suitable medium, such as an optical storage medium or a solid-state medium supplied together with or as part of other hardware, but may also be distributed in other forms, such as via the Internet or other wired or wireless telecommunication systems.

Any reference signs in the claims should not be construed as limiting the scope thereof.

The invention claimed is:

1. A measurement apparatus for determining the deposition rate of a first evaporation source resp. the thickness of a layer deposited on a substrate by the first evaporation source in vapour deposition applications, especially in organic light emitting diode (OLED) mass production, said apparatus comprising:
    a mobile element for providing a surface on which at least one film of vapour can be deposited, wherein the film is to be deposited by a second evaporation source in a deposition location;
    a thickness detector for detecting the thickness of a film deposited on said mobile element, wherein said thickness detector is arranged, face to face with said mobile element, at a detection location in which the thickness of a film deposited on said mobile element is to be detected;
    an actuator device for conveying said mobile element;
    wherein said measurement apparatus is arranged to provide said mobile element from the deposition location to said detection location, and
    wherein said measurement apparatus is further arranged to at least one of measure and control the deposition of said first evaporation source in dependence on the thickness of the at least one film deposited on said mobile element by the second evaporation source.

2. The apparatus according to claim 1,
    wherein said measurement apparatus is further arranged to provide said mobile element from said deposition location to said detection location within a specific time delay and
    wherein for a specific instant of time of detection, said measurement apparatus is further arranged to correlate a specific surface area of the mobile element with the instant of time of deposition, so that the thickness of the film in this surface area can be detected in correlation to the instant of time of deposition.

3. The apparatus according to claim 2, wherein said apparatus is arranged to adjust a time delay between the instant of time of deposition and the instant of time of detection with reference to a deposition spot at said deposition location and a detection spot at said detection location, and wherein the time delay is in the range of several seconds to several minutes.

4. The apparatus according to claim 1, wherein said actuator device is arranged to adjust the speed of conveyance, wherein said thickness detector is arranged to optically detect the thickness of the film, wherein said actuator device comprises a feeder and a cassette, and wherein a thickness value of an optimal thickness of the film is in the range of about 10 to 200 nm.

5. The apparatus according to claim 1, wherein said actuator device is provided in the form of a cassette-tape system comprising a feeder, a cassette and at least one deflection pulley, wherein said mobile element is a band-conveyor provided in the form of a tape, and wherein said band-conveyor is arranged to handle a film with a thickness of 10 to 200 nm.

6. An evaporation device comprising a measurement apparatus according to claim 1, further comprising a first evaporation source in the form of a shower head with a multitude of shower nozzles for depositing at least one layer on a substrate, and a second evaporation source for depositing at least one film on the mobile element provided by said measurement apparatus,
wherein the actuator device provided by said measurement apparatus is arranged to convey said mobile element alongside the second evaporation source so that a film can be deposited on said mobile element, and
    wherein said evaporation device is arranged to provide a film thickness on said mobile element independently from the thickness of any layer deposited on the substrate.

7. An evaporation device according to claim 6, wherein said mobile element is arranged to provide the surface on which a film can be deposited by said second evaporation source simultaneously to the deposition of a layer on the substrate with the same feed rate as the feed rate of the substrate so that the speed of conveyance corresponds to the feed rate of the substrate; and
    wherein said device is arranged to correlate, especially based on specific time delay information provided by said measurement apparatus, the measured film thickness to the thickness of a layer deposited on the substrate by the first evaporation source in order to determine the thickness of the layer.

8. The evaporation device according to claim 6, wherein said measurement apparatus is arranged in a location face to face with the location of a conventional quartz crystal oscillator or in a location in which a conventional quartz crystal oscillator alternatively could be arranged,
    wherein vapour for evaporating the substrate and said mobile element is provided by an evaporator arranged at said evaporation device,
    wherein said evaporation device is arranged to adjust the thickness of the film deposited on the mobile element by at least one of the size of said second evaporation source, the geometry of said second evaporation source, the distance between of said mobile element and said second evaporation source at deposition spot, and/or the speed of conveyance, and
wherein said second evaporation source and said measurement apparatus are arranged to deposit different materials independently on the mobile element and to measure single layer films.

9. A method of determining the deposition rate of a first evaporation source resp. the thickness of a layer deposited on a substrate by the first evaporation source in vapour deposition applications, especially in organic light emitting diode (OLED) mass production, said method comprising:
    passing a substrate alongside the first evaporation source so that at least one layer can be deposited on the substrate;
    simultaneously to passing a substrate, conveying a mobile element by a actuator device alongside a second evaporation source so that at least one film can be deposited on said mobile element at a deposition location;
    depositing at least one film on said mobile element by the second evaporation source, a respective film being provided with a thickness defined in dependence on a target value of the thickness of a respective layer deposited on the substrate; and
    adjusting said actuator device in order to provide a respective film with a thickness value (vt) of an optimal thickness of the film.

10. The method according to claim 9, the method further comprising detecting the thickness of the deposited film in a detection location by thickness detector, the detection location differing from the deposition location in such a way that detection can be carried out after a specific time delay; and
    wherein for a specific instant of time of detection, said measurement apparatus is further arranged to correlate a specific surface area of the mobile element with the instant of time of deposition, so that the thickness of the film in this surface area can be detected in correlation to the instant of time of deposition.

11. The method according to claim 10, wherein said apparatus is arranged for providing said mobile element from said deposition location to said detection location; and
    wherein the reading of detection is proportional to the thickness of a layer deposited on a substrate.

12. The method according to claim 9, wherein an initial calibration is performed through a tooling process similar to a tooling process used for conventional quartz crystal oscillators.

13. A system for determining the deposition rate of a first evaporation source resp. the thickness of a layer deposited on a substrate by the first evaporation source in vapour deposition applications, especially in organic light emitting diode (OLED) mass production, said system comprising:
    an evaporation device according to claim 6;
    an evaporation chamber;
    wherein the second evaporation source provided by said evaporation device is in communication with the first evaporation source provided by said evaporation device so that the second evaporation source can deposit at least one film with a film thickness in dependence on the deposition rate of the first evaporation source; and
    wherein said measurement apparatus is arranged to adjust the thickness of the film deposited on the mobile element independently from the thickness of a layer deposited on a substrate.

14. A system according to claim 13, wherein, apart from said thickness detector, said measurement apparatus is entirely arranged within said evaporation chamber,
    wherein at least the measurement head of said thickness detector is installed outside said evaporation chamber, the mobile element being observed through a viewport, and wherein vapour for evaporating the substrate and the mobile element is provided by an evaporator arranged within the body structure of said evaporation device.

15. A non-transitory, computer-readable storage medium with an executable program stored thereon, where the program instructs a processor to perform steps of method claim 9.

16. The apparatus according to claim 1, wherein the second evaporation source is in communication with the first evaporation source so that the film has a film thickness in dependence on the deposition rate of the first evaporation source.

17. The method according to claim 9, wherein the second evaporation source is in communication with the first evaporation source so the film has a film thickness in dependence on the deposition rate of the first evaporation source.

* * * * *